(12) United States Patent
O'Donnell et al.

(10) Patent No.: US 7,632,451 B1
(45) Date of Patent: Dec. 15, 2009

(54) CERAMIC SCREEN PRINTING APPARATUS

(75) Inventors: Marissa A. O'Donnell, Columbia, MD (US); Cynthia W. Berry, Pasadena, MD (US); Rena Y. Jacobson, Ellicott City, MD (US); Wayne A. Smythe, Pasadena, MD (US); Glenn A. Cooke, Clarksville, MD (US); Shane H. Dennison, Frederick, MD (US); Robert H. Fisher, Westminster, MD (US)

(73) Assignee: Northrop Grumman Corporation, Los Angeles, CA (US)

( * ) Notice: Subject to any disclaimer, the term of this patent is extended or adjusted under 35 U.S.C. 154(b) by 651 days.

(21) Appl. No.: 10/960,108

(22) Filed: Oct. 8, 2004

(51) Int. Cl.
*C04B 33/34* (2006.01)

(52) U.S. Cl. ...................... 264/619; 101/129

(58) Field of Classification Search ........... 101/129; 428/210; 156/240; 264/619
See application file for complete search history.

(56) References Cited

U.S. PATENT DOCUMENTS

| 2,963,964 | A | 12/1960 | Klump |
| 4,216,717 | A | 8/1980 | Hall et al. |
| 5,694,843 | A | 12/1997 | Chen et al. |
| 2003/0131742 | A1 | 7/2003 | Kanda |

*Primary Examiner*—Carlos Lopez
(74) *Attorney, Agent, or Firm*—Andrews Kurth LLP

(57) ABSTRACT

The print head and screen assembly of a Semi-Automatic Screen Printer is raised above its normal printing height and selective attachment of several different fixtures on the nest plate for holding the substrate in a desired position during a screen printing operation for printing gold on LTCC substrates.

12 Claims, 5 Drawing Sheets

CERAMIC SCREEN PRINTING APPARATUS

CROSS REFERENCE TO RELATED APPLICATION

This application is related to U.S. Ser. No. 10/718,805 entitled "Fabrication of LTCC T/R Modules With Multiple Cavities And An Integrated Ceramic Ring Frame" filed on Nov. 24, 2003 in the name of Rena Y. Jacobson et al., and to U.S. Ser. No. 10/896,174 entitled "Apparatus and Method for Side Printing On Low Temperature Co-Fired Ceramic (LTCC) Substrates" filed on Jul. 22, 2004 in the name of Rena Y. Jacobson, et al., which are assigned to the assignee of the present invention and which are incorporated herein by reference.

BACKGROUND OF THE INVENTION

1. Field of the Invention

This invention relates generally to screen printing on a laminated assembly of low temperature co-fired ceramic (LTCC) material, and more particularly to a method and apparatus for screen printing gold onto fired LTCC substrates of microwave transmit/receive (T/R) modules to provide a solderable surface for side connectors, ring frames, and heat sinks that package the ceramic.

2. Description of Related Art

In forming an LTCC substrate, such as shown in related application Ser. No. 10/718,805, typically a number of LTCC tape layers are initially divided into multiple stacks of tape layers, e.g., four stacks or sections, based on a final cavity routing configuration of each stack. One of the stacks preferably comprises a set of layers for the formation of a ceramic ring frame. Each stack is then separately tack laminated, followed by cavity patterns being machined therein using a router device whereby a large number of layers are routed in a single pass, forming cavities having side walls which are relatively smooth and straight as opposed to the known prior art method of cutting individual layers with a laser, for example, which results in the formation of jagged side walls. Following cavity routing, all of the stacks are laid up on a base plate including a set of tooling pins for providing alignment of the stacks. The lay up is completed with a placement of a top mylar template followed by a copper template. The assembly is next covered with an expandable latex sheet that has been lightly coated with material for aiding the removal of the latex sheet without metal lift-off after lamination. The assembly is then placed in a lamination fixture and isostatically laminated for a specific period of time at a predetermined pressure and temperature, typically 4000-5000 psi at 72° C. for 15 minutes, resulting in a structure in the form of laminated panel. The panel is then allowed to cool, removed from the fixture where it is green cut to remove tooling holes and then fired with a designated firing profile. A plurality of mutually identical newly designed LTCC substrates for a T/R module are then diced, i.e. cut, from the panel and post fire printed as required.

Due to the design of conventional screen printers, e.g., the well known MPM SP-1500 printer, the printing of post-fired LTCC substrates incorporating the above noted design was limited to a certain range of the overall thickness of the substrate or board. For instance, the allowable thickness of the substrates were limited to less than 1" maximum. Substrates with a thickness greater than 1" were not able to access the print position inside of the standard screen printing machine due to the fact that the printer head was in the way. Accordingly, screen printing LTCC substrates in the post-fired condition require a certain type of unique fixturing of the substrate on a screen printer for accurate and consistent placement of the printed pattern.

SUMMARY OF THE INVENTION

Accordingly, it is an object of the present invention to provide an apparatus for performing screen printing on an LTCC substrate in the post-fired condition.

It is another object of the present invention to provide an assembly for performing screen printing on an LTCC substrate using standard screen printers.

These and other objects are achieved in the present invention by an improved apparatus and method for screen printing gold on LTCC substrates by a modification of an MPM SP-1500 Semi-Automatic Screen Printer by raising the print head and screen assembly above its normal printing height and selective attachment of several different fixtures on the nest plate for holding the substrate in a desired position during a screen printing operation.

In one aspect of the invention there is provided an apparatus for enabling printing on ceramic material including low temperature co-fired ceramic material, comprising: screen-printing apparatus for applying a predetermined pattern of metallization to a surface of ceramic material and including a fixture support plate which is movable under a print head having a screen-printing assembly and having a first separation distance between the fixture support plate and the print head during a screen-printing operation; a modification of said screen-printing apparatus whereby the print head is raised above the fixture support plate so as to provide a second separation distance greater than said first separation distance during a printing operation; and a fixture located on a surface of the fixture support plate for holding said ceramic material in a selected orientation during a screen-printing operation.

In another aspect of the invention there is provided an apparatus for enabling printing on ceramic material, including low temperature co-fired ceramic (LTCC) material, comprising: a fixture located on a support member moved under a print head during a printing operation, said fixture includes a base plate for attachment to said support plate of the screen printing apparatus, an intermediate body member on said base plate, a top plate on said intermediate body member, and a slot in the top plate extending into the body for holding said ceramic material; and wherein said ceramic material comprises a laminate assembly includes top, bottom and side surfaces and said fixture includes a slot for holding said laminate assembly so as to enable printing of said pattern of metallization on said side surface.

In a further aspect of the invention there is apparatus for enabling printing on ceramic material, including low temperature co-fired ceramic (LTCC) material, comprising: a fixture located on a support member moved under a print head during a printing operation, said fixture includes a base plate for attachment to said support plate of the screen printing apparatus, a body member on said base plate including a recessed shelf in a top surface thereof for holding said ceramic material; and wherein said ceramic material comprises a laminate assembly which includes top, bottom and side surfaces and said recessed shelf holding said laminate assembly so as to enable printing of said pattern of metallization on selectively said top and bottom surfaces of the laminate assembly.

And still further there is provided an apparatus for enabling printing on ceramic material, including low temperature co-fired ceramic (LTCC) material, comprising: a fixture located on a support member moved under a print head during a printing operation, said fixture includes a base plate for attachment to said support plate of the screen printing apparatus, an intermediate body member on said base plate, a top plate on said intermediate body member, and a vertical bore through said base plate, said body member, and said top plate and being connected to a vacuum source for holding said ceramic material in place on the top plate; and wherein said ceramic material comprises green ceramic tape and said green ceramic tape being held in place on the top plate so as to enable printing of said pattern of metallization thereon.

Further scope of applicability of the present invention will become apparent from the detailed description provided hereinafter. It should be noted, however, that the detailed description and specific examples, while indicating the preferred method of the invention, are provided by way of illustrations only, since various changes, alterations and modifications coming within the spirit and scope of the invention will become apparent to those skilled in the art from the following detailed description.

BRIEF DESCRIPTION OF THE DRAWINGS

The present invention will become more fully understood when considered in conjunction with the accompanying drawings, which are provided by way of illustration and thus are not meant to be considered in a limiting sense, and wherein.

DETAILED DESCRIPTION OF THE INVENTION

Figure 1:
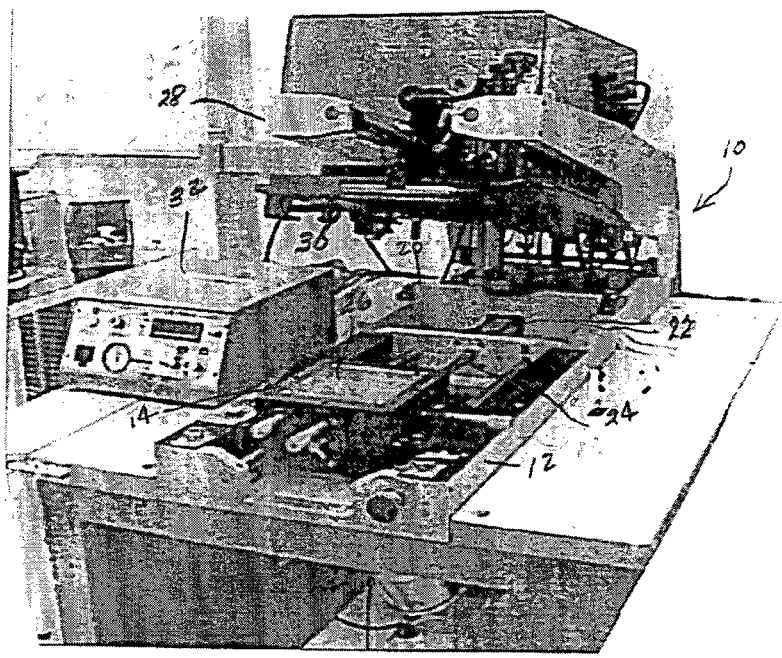
FIG. 1 is a front elevational view of a standard MPM SP-1500 screen printer.
Figure 2:
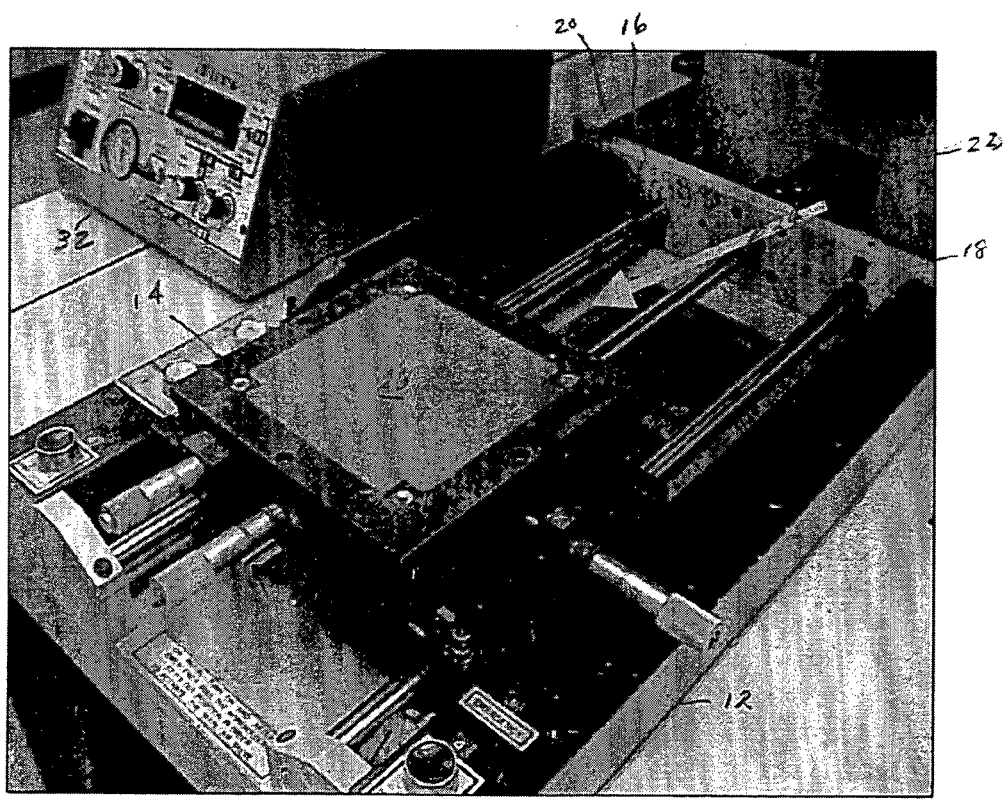
FIG. 2 is a perspective view further illustrative of the screen printer shown in FIG. 1.

Referring now to the drawings, and more particularly to FIGS. 1 and 2, shown thereat is a well known MPM SP-1500 semi-automatic screen printer 10 which includes, among other things, a generally rectangular bed 12, a workholder nest plate 14 which is mounted on rails 16 and 18 supported by a frame assembly 20. The nest plate 14 is adapted to be moved forwardly and rearwardly by a motor 22 and connecting rod 24. The nest plate 14 shown in FIG. 1 is fitted with a porous vacuum plate 26 which is moved under a print head 28 having a screen assembly 30 including a squeegee head when lowered during a printing operation. Reference numeral 32 denotes a control console for the printer.

Figure 3:
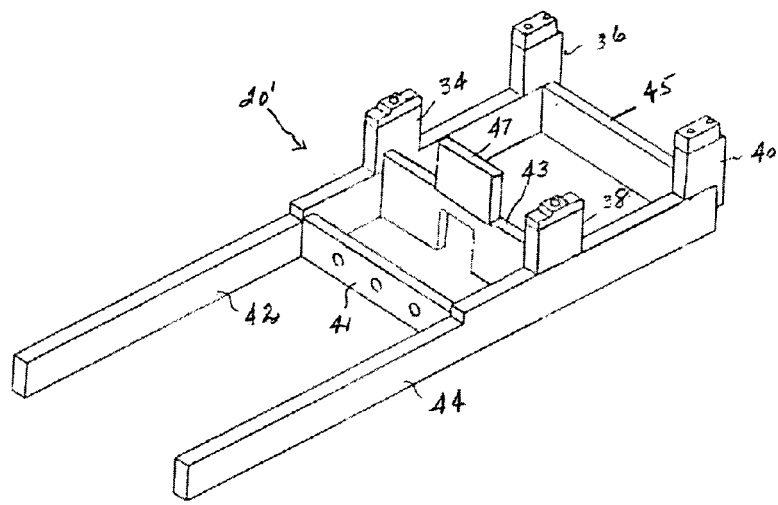
FIG. 3 is a perspective view of a frame assembly including 3 in. spacer members used to raise the print head and screen of the screen printer shown in FIG. 1.
Figure 4:
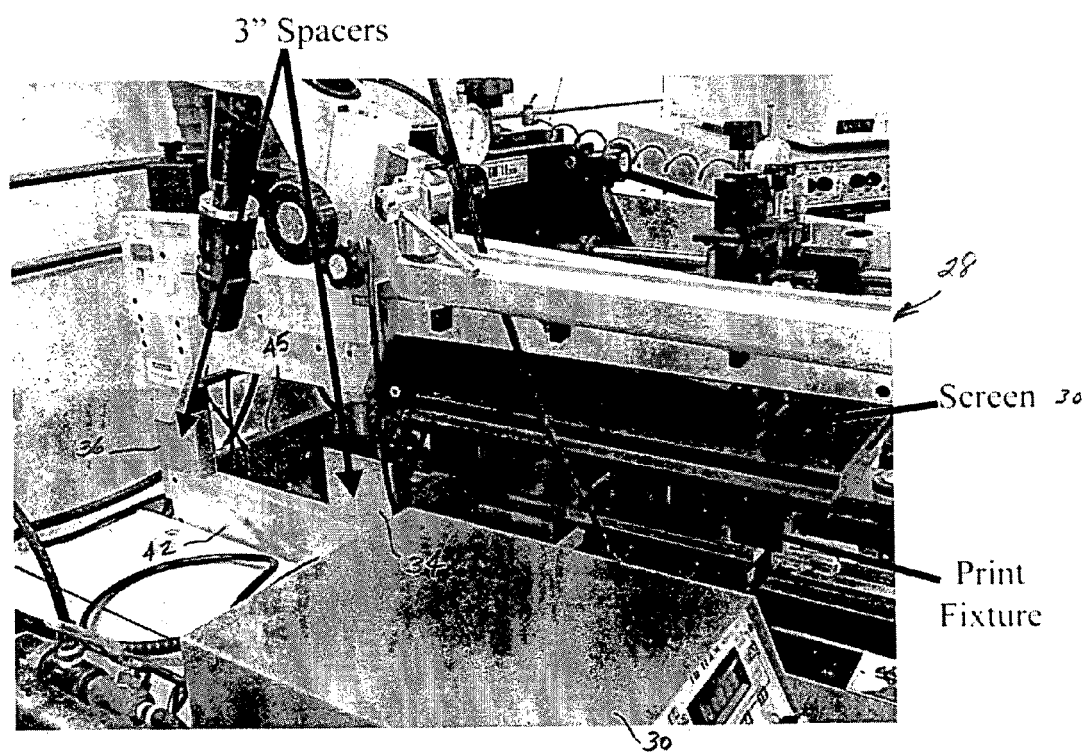
FIG. 4 is a side elevational view of the frame assembly shown in FIG. 3 installed in the screen printer shown in FIG. 1.

In a desire to use the MPM SP-1500 printer 10 for screen printing on a substrate such as shown in related application Ser. No. 10/718,805 referenced above, it was noted that the height of the substrate when stood on its end, for example, would not clear the bottom surface of the printer head 28. In order to overcome the height problem of the substrate in relation to the printer head 28, the first step taken in the subject invention was to raise the height of the screen assembly 30 in its lowered position 3 in. above the nest plate 14 as shown in FIG. 4. This is achieved by modifying the frame assembly 20 shown in FIGS. 1 and 2 to a frame assembly 20' such as shown in FIG. 3. The frame assembly 20' is similar to the frame assembly 20 except for four upwardly facing 3 in. spacer elements 34, 36, 38 and 40 located in a generally rectangular arrangement on the rear portion of a pair of elongated side members 42 and 44 and a spacer element 43 located on the cross member 43. Cross members 41, 43 and 45 are secured to the side members 42 and 44 in the same manner as in the conventional frame 20 of FIG. 1.

Figure 5:
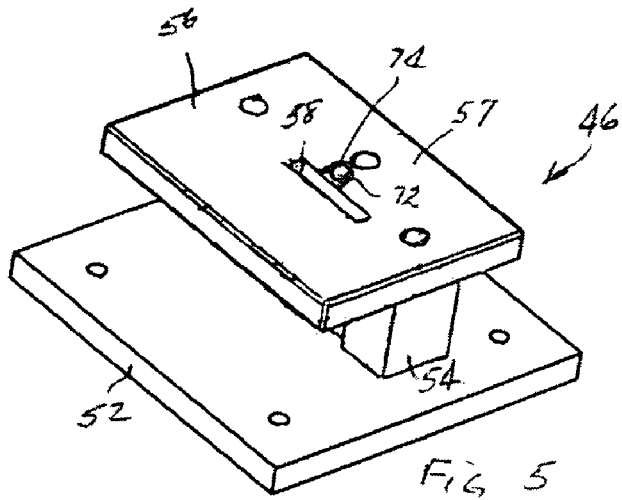
FIGS. 5, 6 and 7 are illustrative of three different fixtures which can be mounted on the nest plate of the screen printer shown in FIG. 2.
Figure 6:
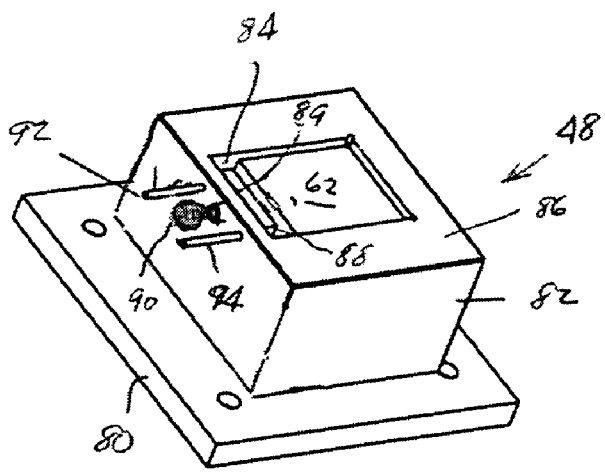
Figure 7:
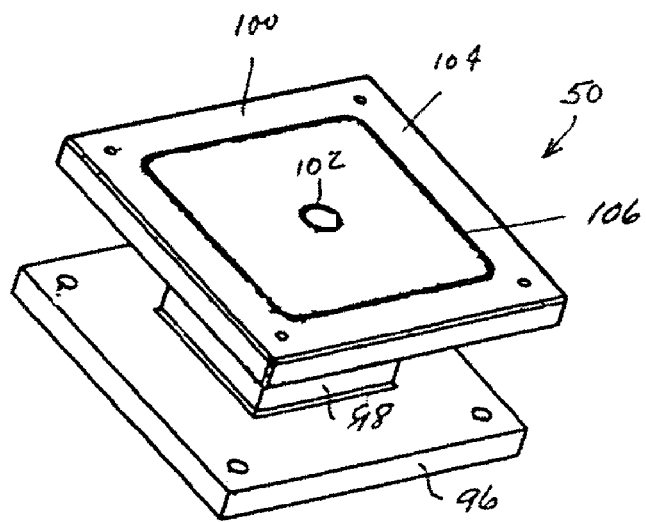

With the print head 28 and screen assembly 30 now raised 3 in. by virtue of the frame assembly 20' shown in FIG. 3, the present invention is used in connection with three separate screen printing fixtures as shown in FIGS. 5, 6 and 7, and which are attachable to the printer nest plate 14. The fixture shown in FIG. 5 and identified by reference numeral 46, is utilized for holding parts, e.g., an LTCC substrate, vertically for side printing while the fixture shown in FIG. 6 and identified by reference numeral 48 is designed to hold parts horizontally on a recessed shelf for printing on the top and bottom surfaces of a substrate. The fixture shown in FIG. 7 and identified by reference numeral 50 comprises a fixture for screen printing layers of LTCC green tape. All three fixtures 46, 48 and 50 are fabricated in resin so as to allow for inexpensive and also speedy manufacturing.

Figure 8:
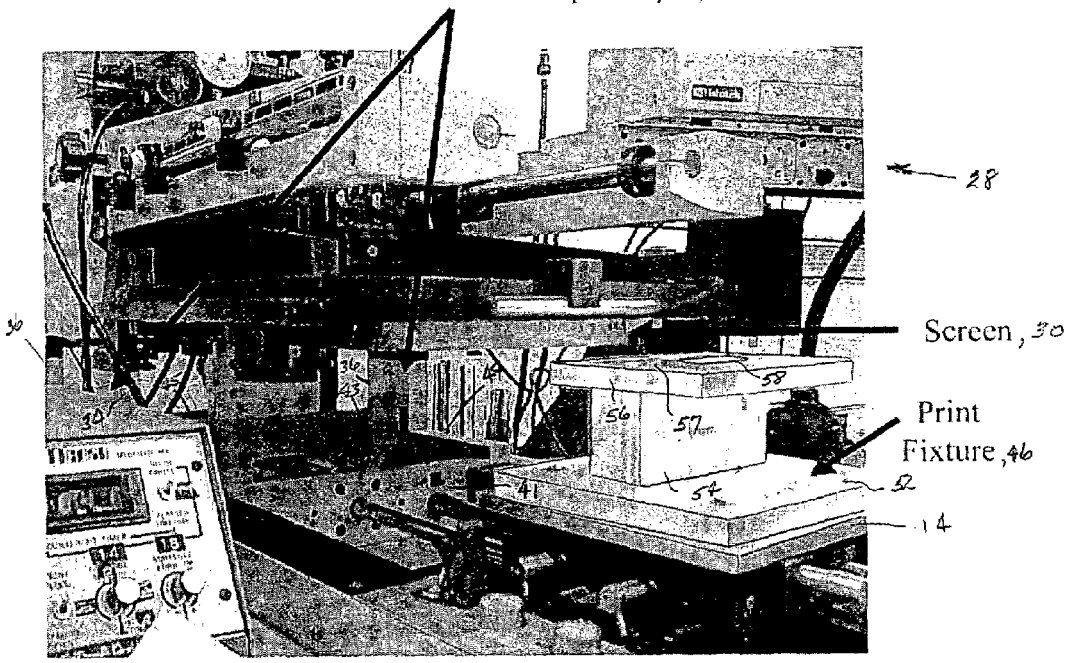
FIG. 8 is a perspective view of the fixture shown in FIG. 5 mounted on the nest plate.
Figure 9:
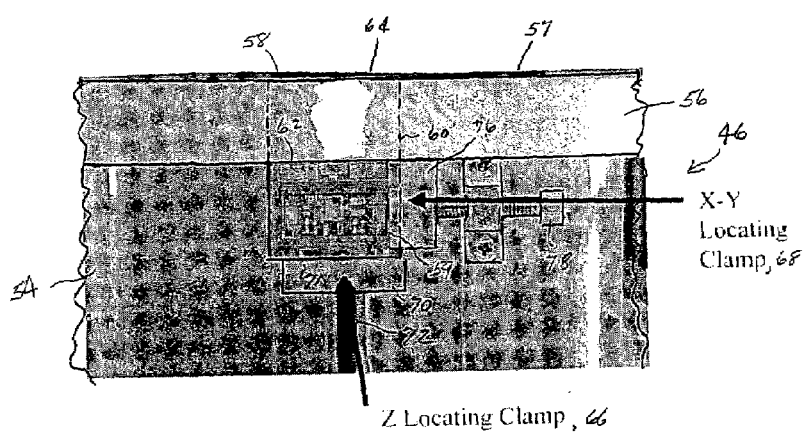
FIG. 9 is a partial view of the fixture shown in FIG. 5 illustrating two clamp assemblies used to position a substrate inserted vertically in the top of the fixture shown in FIG. 5.
Figure 10:
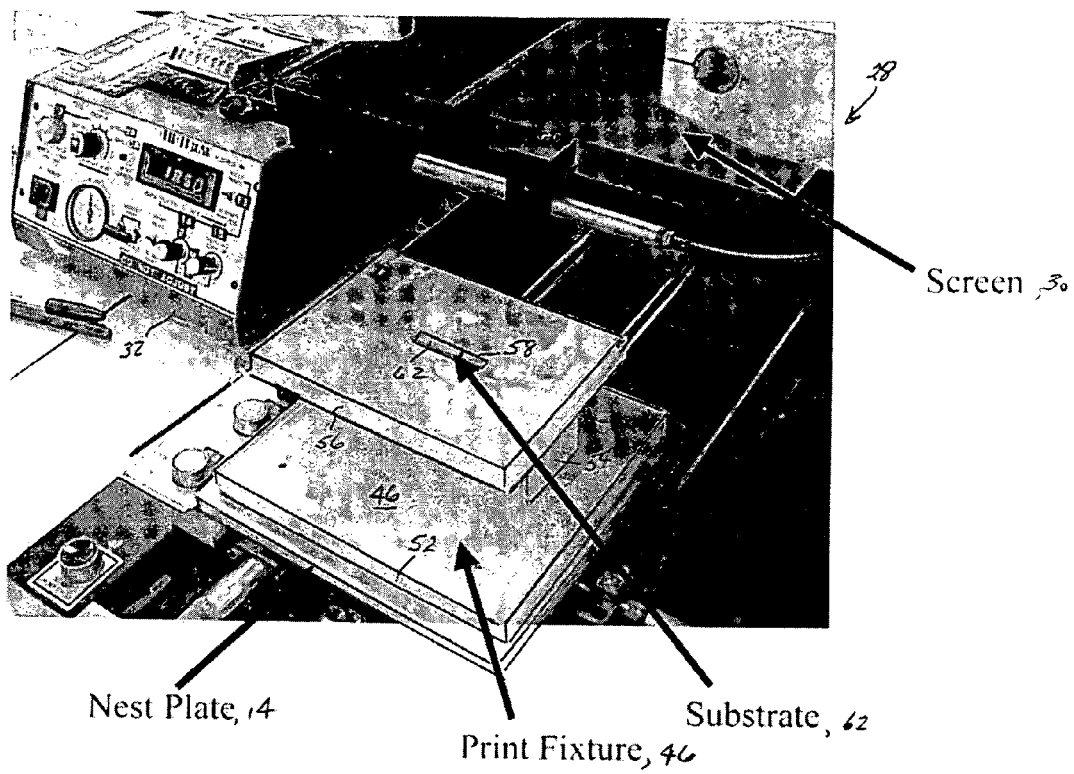
FIG. 10 is further illustrative of the fixture shown in FIG. 5 mounted on the nest plate.

Considering now the details of the side print fixture 46 shown in FIG. 5, and which is additionally disclosed in FIGS. 8, 9 and 10, fixture 46 includes a base plate 52 which can be bolted to the nest plate 14 as shown in FIG. 8. An intermediate body member 54 on the base plate 52 forms a pedestal upon which is located a top plate 56 including an aperture 58 for a vertical slot 60, shown in FIG. 9, and extending down into the body member 54 so that an LTCC substrate 62 can be inserted vertically therein for printing on the top side surface 64 thereof when contacted by a squeegee head, not shown, which forms part of the print screen assembly 30. The substrate 62 is fully enclosed in the resin fixture 46 and is held in position by a vertical locating clamp assembly 66 and a horizontal locating clamp assembly 68. As shown in FIG. 9, the clamp assembly 66 includes a substrate engaging member 70 which contacts the bottom surface 71 of the substrate 62 and a threaded bolt member 72 located behind the slot 58 in the recess 74, as shown in FIG. 5, which is adapted to move the member 70 vertically so that the top surface 64 of the substrate 62 projects slightly above the top surface 57 of the top plate 56. The horizontal locating clamp 68 likewise includes a substrate engaging member 76 which is moved horizontally by means of a threaded bolt 78 and acts to firmly hold the substrate 62 in place in the fixture slot 60.

With respect to the second fixture 48 shown in FIG. 6, it also includes a base plate 80 which can be attached to the nest plate 14. On the base plate 80 is located a generally rectangular pedestal 82 having a recessed shelf 84 formed on the top surface 86. FIG. 6 shows an LTCC substrate 62 located on the shelf 84. A single clamp assembly 88 including a pressure plate member 89 is adapted to contact a side edge of the substrate 62 located in the recess of the shelf 84 and can be moved inwardly by means of a threaded screw 90 as needed. A pair of guide pins 92 and 94 project through the pedestal 82 so that the pressure plate 88 moves so as to exert balanced pressure against the substrate 62 when positioned on the recessed shelf 84.

Accordingly, the top and bottom as well as side surfaces of a substrate 62 can be printed on demand.

Figure 11:
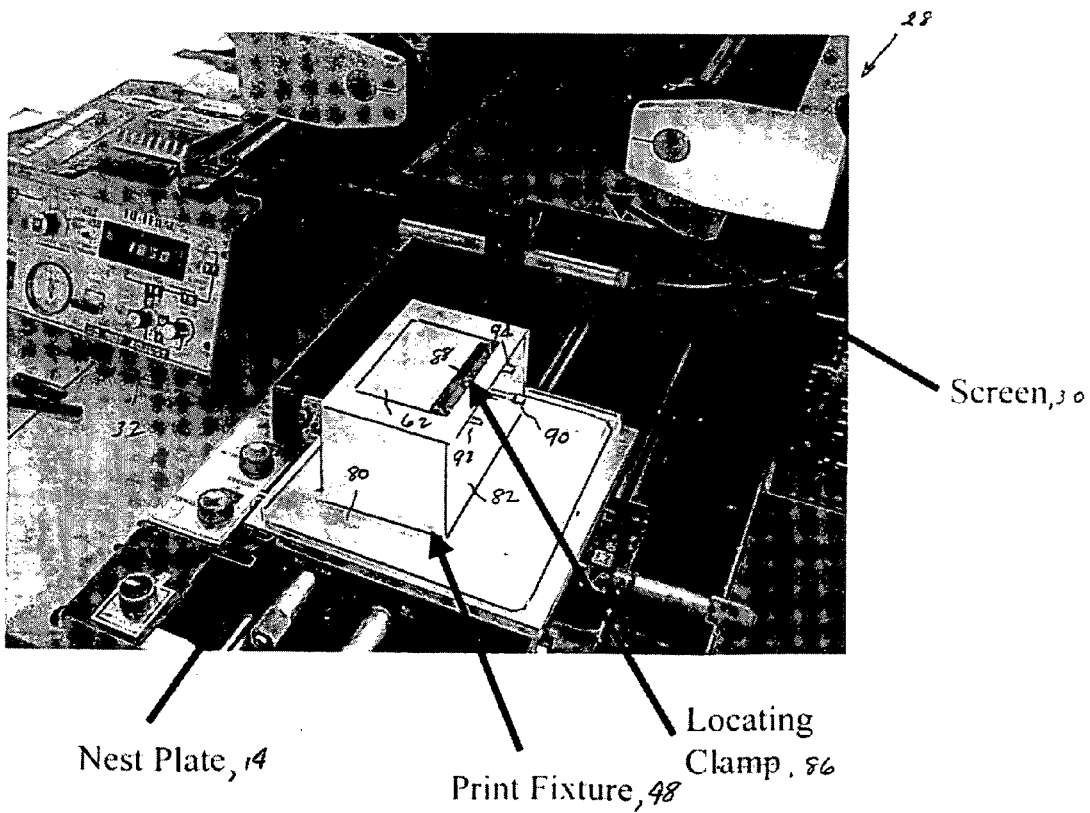
FIG. 11 is a perspective view of the fixture shown in FIG. 6 mounted on the nest plate.

FIG. 11 discloses the third fixture 48 mounted on the nest plate 14 in the same manner that the fixture 46 is bolted onto nest plate 14 as shown in FIG. 10. The third fixture 50 as shown in FIG. 7 is used when there is a requirement to print green ceramic tape layers at the 3 in. elevated height as shown for the fixtures 46 and 48. The fixture 50 includes a vertical bore 102 which extends through the top plate 100, the pedestal 98, and the base plate 96 for coupling to a vacuum source, not shown, which is required to hold thin layers of tape in place on the top surface 104 when placed thereon. The top surface 104 also includes a generally rectangular recess 106 surrounding the bore 102 so as to receive an O-ring for additionally holding the tape layers in place on the fixture 50.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

The invention claimed is:

1. Apparatus for enabling printing on ceramic material including low temperature co-fired ceramic material, comprising:

screen-printing apparatus for applying a predetermined pattern of metallization to a surface of ceramic material and including a fixture support plate which is movable under a print head having a screen-printing assembly and having a first separation distance between the fixture support plate and the print head during a screen-printing operation;

a modification of said screen-printing apparatus whereby the print head is raised above the fixture support plate so as to provide a second separation distance greater than said first separation distance during a printing operation, wherein said modification comprises a set of spacer members located on a frame assembly located in a bottom portion of the screen-printing apparatus for providing said second separation distance, wherein said second separation distance is substantially 3 in. or more; and a fixture located on a surface of the fixture support plate for holding said ceramic material in a selected orientation during a screen-printing operation, wherein the fixture is located on the top surface of the fixture support plate, and wherein said fixture includes a base plate for attachment to said support plate of the screen printing apparatus, an intermediate body member on said base plate, a top plate on said intermediate body member, and a slot in the top plate extending into the body for holding said laminate assembly, wherein said ceramic material comprises a laminate assembly includes top, bottom and side surface and said fixture includes a slot for holding said laminate assembly so as to enable printing of said pattern of metallization on said side surface.

2. The apparatus according to claim 1 wherein the fixture support plate comprises a nest plate of said screen-printing apparatus.

3. The apparatus according to claim 1 wherein said fixture includes at least one clamp assembly for holding said laminate assembly in place in the slot.

4. The apparatus according to claim 3 wherein said at least one clamp assembly comprises a pair of clamp assemblies including a horizontal clamp assembly and a vertical clamp assembly.

5. The apparatus according to claim 1 wherein said fixture is fabricated in resin.

6. The apparatus according to claim 1 said fixture includes a recessed shelf for holding said laminate assembly so as to enable printing of said pattern of metallization on selectively said top and bottom surfaces.

7. The apparatus according to claim 6 wherein said fixture includes a base plate for attachment to said support plate of the screen printing apparatus, a body member on said base plate including said recessed shelf for holding said laminate assembly in the top surface thereof.

8. The apparatus according to claim 7 wherein said fixture includes a clamp assembly for holding said laminate assembly in place in said recessed shelf.

9. The apparatus according to claim 8 wherein said fixture includes a resin fixture that is fabricated in resin.

10. Apparatus for enabling printing on ceramic material including low temperature co-fired ceramic material, comprising:

screen-printing apparatus for applying a predetermined pattern of metallization to a surface of ceramic material and including a fixture support plate which is movable under a print head having a screen-printing assembly and having a first separation distance between the fixture support plate and the print head during a screen-printing operation;

a modification of said screen-printing apparatus whereby the print head is raised above the fixture support plate so as to provide a second separation distance greater than said first separation distance during a printing operation, wherein said modification comprises a set of spacer members located on a frame assembly located in a bottom portion of the screen-printing apparatus for providing said second separation distance, wherein said second separation distance is substantially 3 in. or more; and a fixture located on a surface of the fixture support plate for holding said ceramic material in a selected orientation during a screen-printing operation, wherein the fixture is located on the top surface of the fixture support plate, wherein said fixture includes a base plate for attachment to said support plate of the screen printing apparatus, an intermediate body member on said base plate, top plate on said intermediate body member, and vertical bore through said base plate, said body member, and said top plate connected to a vacuum source for holding said ceramic tape in place on the top plate, wherein said ceramic material comprises green ceramic tape and said fixture includes a plate for holding said green ceramic tape in place so as to enable printing of said pattern of metallization thereon.

11. The apparatus according to claim 10 wherein said fixture includes an O-ring assembly comprising a recess surrounding said bore for holding an O-ring, and an O-ring located in said recess for providing a vacuum seal for the ceramic tape.

12. The apparatus according to claim 11 wherein said fixture is fabricated in resin.

\* \* \* \* \*